(12) United States Patent
Civay et al.

(10) Patent No.: US 9,397,012 B2
(45) Date of Patent: Jul. 19, 2016

(54) TEST PATTERN FOR FEATURE CROSS-SECTIONING

(71) Applicant: GLOBALFOUNDRIES Inc., Grand Cayman (KY)

(72) Inventors: Deniz E. Civay, Clifton Park, NY (US); Ralph Schlief, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 39 days.

(21) Appl. No.: 14/316,915

(22) Filed: Jun. 27, 2014

(65) Prior Publication Data

US 2015/0380320 A1    Dec. 31, 2015

(51) Int. Cl.
| | | |
|---|---|---|
| H01L 21/8242 | (2006.01) | |
| H01L 21/66 | (2006.01) | |
| H01L 21/78 | (2006.01) | |
| G01B 11/00 | (2006.01) | |
| G03F 1/44 | (2012.01) | |

(52) U.S. Cl.
CPC .............. *H01L 22/12* (2013.01); *G01B 11/002* (2013.01); *G03F 1/44* (2013.01); *H01L 21/78* (2013.01); *H01L 22/30* (2013.01)

(58) Field of Classification Search
CPC ....... H01L 22/12; H01L 21/78; G01B 11/002
See application file for complete search history.

(56) References Cited

U.S. PATENT DOCUMENTS

| | | | | |
|---|---|---|---|---|
| 6,569,584 | B1* | 5/2003 | Ho ............................. | G03F 1/40 430/5 |
| 2005/0142454 | A1* | 6/2005 | Fujimoto ................ | G03F 1/144 430/5 |
| 2006/0172447 | A1* | 8/2006 | Do ....................... | G03F 7/70625 438/27 |
| 2007/0108368 | A1* | 5/2007 | Mieher ................ | B22D 11/064 250/201.2 |
| 2011/0001239 | A1* | 1/2011 | Hsieh ................ | H01L 23/49816 257/738 |
| 2013/0295698 | A1* | 11/2013 | Pforr ......................... | G03F 1/38 438/14 |
| 2014/0065734 | A1* | 3/2014 | Bauch ................. | G03F 7/70633 438/14 |
| 2014/0256067 | A1* | 9/2014 | Cheng ..................... | H01L 22/12 438/14 |
| 2015/0115986 | A1* | 4/2015 | Wang ................. | G01R 31/2601 324/750.3 |

\* cited by examiner

*Primary Examiner* — A. Sefer
(74) *Attorney, Agent, or Firm* — Amerson Law Firm, PLLC

(57) ABSTRACT

A method includes forming a first plurality of instances of a first pattern on a substrate. The first pattern includes a plurality of features defining a first spacing between features in a first direction. The instances in the first plurality are offset from one another at least in a second direction other than the first direction. The substrate is cleaved along a cleavage line. At least a first critical dimension of a feature in the first plurality of instances intersected by the cleavage line is measured.

10 Claims, 6 Drawing Sheets

TEST PATTERN FOR FEATURE CROSS-SECTIONING

BACKGROUND OF THE INVENTION

1. Field of the Invention

The present disclosure generally relates to the fabrication of integrated circuits, and, more particularly, to reticles for forming test patterns for feature cross-sectioning and methods of using the reticles and wafers fabricated using the reticles.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed and reduce the power consumption of circuit elements. The continuing scaling of feature sizes, however, involves great efforts in redesigning process techniques and developing new process strategies and tools so as to comply with new design rules.

As the critical dimensions of the circuit elements decrease, the dimensions of metal lines, vias and contact elements used to interconnect and access the circuit elements also decrease. The feature sizes are reduced to a level that the photolithography processes used to form the features approach physical limits with respect to the wavelengths of the radiation used to form the features. During the patterning of contacts, a photoresist or mask layer is formed above a dielectric or other layer on a substrate. An optical system transfers a circuit design printed on a reticle to the photoresist layer through an optical radiation illumination and projection system. An important aspect of the patterning process is ensuring that the right amount of radiation (dose) is transferred through the reticle to the photoresist layer. Underexposing the features can result in the incomplete formation of the features in the photoresist masking layer for forming the contact openings. Material remains in the bottom corners of the contact openings, a defect commonly referred to as scumming. When a subsequent contact etch is performed, the pattern is not effectively transferred to the dielectric or other layers below.

To evaluate the effectiveness of the photolithography, etch or additional process steps, a reticle may be fabricated that includes an array of contact patterning features. The reticle is used to pattern contact patterns in a photoresist layer on one or more test wafers. After exposing and developing the photoresist layer and performing any post-exposure etch processes to define the contact patterns in the underlying layers, the test wafer is cross-sectioned. It can be evaluated using metrology equipment to identify the critical dimensions of the contact patterns, sidewall profile and the presence of scumming defects. This characterization is commonly used during a research and development stage to evaluate the printability of a new device fabrication process. The resist patterned wafer may also be cross-sectioned before contact etch.

The design to be implemented on a reticle that is intended for the previously mentioned contact characterization techniques requires definition of the feature of interest's X-critical dimension (X-CD), Y-critical dimension (Y-CD), X-pitch and Y-pitch. An array of contacts is then generated with these X-CD and Y-CD characteristics. The contact array for cleaving in the X-direction is generated by incrementally shifting the contacts a set amount, for example 1 nm, in the Y-direction and shifting the contacts by the X-pitch in the X-direction. The contact array for cleaving in the Y-direction is generated by incrementally shifting the contact a set amount, for example 1 nm, in the X-direction and by shifting the contact by the Y-pitch in the Y-direction. The center-to-center distance between the contacts is slightly larger than the corresponding non-shifted pattern reference pitch. The corner-to-corner shift or offset ensures cleaving at least one contact along its largest dimension (diameter).

FIGS. 1A-1D illustrate the use of a contact test pattern for defining a reticle for patterning test wafers to allow characterization of a photolithography process for forming contact openings on a wafer. FIG. 1A is a diagram illustrating a conventional reticle layout for forming an array of contact patterns on a test wafer. A pattern 100 of contact features 105 is defined for the photolithography process being evaluated. The pattern 100 (collection of contacts) defines a pitch or spacing in the x-direction, Pitch-X. The pattern 100 allows for measuring a critical dimension in the y-direction, CD-Y. As shown in FIG. 1B, the pattern 100 is formed on a reticle 110 and is repeated in the y-direction with an offset in the x-direction between instances of the pattern 100, to facilitate wafer cross-section measurements. The reticle 110 is used to print a test wafer 115 to form contact patterns 120 in a photoresist layer 125, as illustrated in FIG. 1C. The test wafer 115 is cleaved along a vertical cleavage line 130 to cross-section the test wafer 115 to allow analysis of the contact patterns 120 patterned above a substrate layer 140, as illustrated in FIG. 1D.

In FIG. 1D, the contact patterns 120 intersected by the vertical cleavage line 130 are illustrated. The shifting in the x-direction provides a higher probability that any given vertical cleavage line will intersect the center of one or more of the contact patterns 120, where the most useful process, profile, remaining material thickness and contact width data may be collected. The contact patterns 120 can be measured to determine a critical dimension in the y-direction, CD-Y, due to the orientation of the pattern, the shifting in the x-direction, and the y-direction of the cleavage line 130. Outer regions away from the center of the contact opening 135 of the contact patterns 120 may exhibit scumming (photoresist residue) defects or a shallow sidewall angle. If a dielectric layer 140 below the photoresist layer 125 were to be patterned, the contact openings would not be formed properly, i.e., too small or not opened.

An alternate cleave pattern array implements both an x-shift and a y-shift. This allows flexibility in cleaving contact arrays in either the x- or the y-direction.

The conventional test pattern illustrated in FIGS. 1A-1D has several limitations. First, it only allows the measurement of a CD in one direction. In an actual device pattern, the pitch is typically not regular or uni-directional, as the pattern density changes in different regions.

One potential drawback of the current art, in which a pattern shift for neighboring contacts is applied in the x- and y-directions, is that if the shifts are large enough, then the cleave pattern will deviate significantly from the original non-shifted pattern. For example, the cleave pattern for an orthogonal array of contacts will no longer be very orthogonal, and it could print significantly differently from the orthogonal case, due to optical, resist and etch proximity effects.

The present disclosure is directed to various methods of forming patterns that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming substrates including patterns and the resulting semiconductor devices. One method disclosed herein includes, among other things, forming a first plurality of instances of a first pattern on a substrate. The first pattern includes a plurality of features defining a first spacing between features in a first direction. The instances in the first plurality are offset from one another at least in a second direction other than the first direction. The substrate is cleaved along a cleavage line. At least a first critical dimension of a feature in the first plurality of instances intersected by the cleavage line is measured.

One illustrative substrate disclosed herein includes, among other things, a first plurality of instances of a first pattern, the first pattern including a plurality of features defining a first spacing between features in a first direction. The instances in the first plurality are offset from one another in a second direction other than the first direction.

BRIEF DESCRIPTION OF THE DRAWINGS

The disclosure may be understood by reference to the following description taken in conjunction with the accompanying drawings, in which like reference numerals identify like elements, and in which.

Figure 1A:
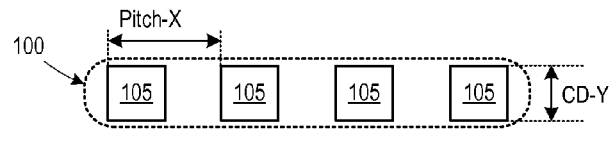
FIGS. 1A-1D illustrate the use of a prior art contact test pattern for defining a reticle for patterning test wafers to allow characterization of a photolithography, etch or subsequent process step for forming contact openings or the final metal-filled contacts on a wafer.
Figure 1B:
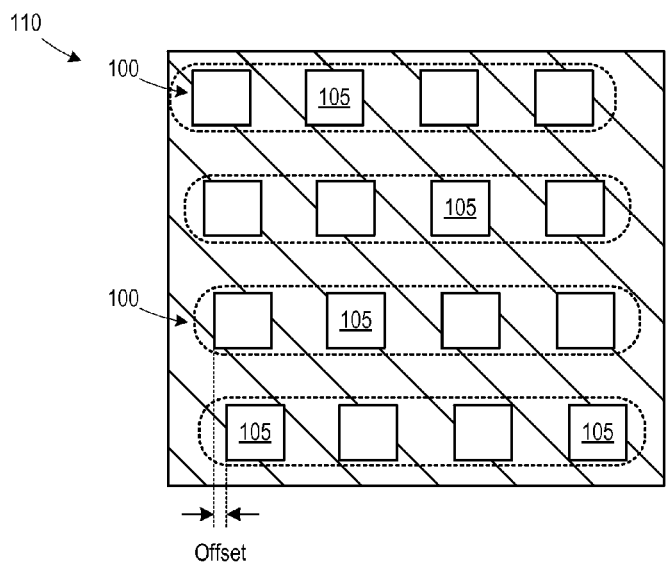
Figure 1C:
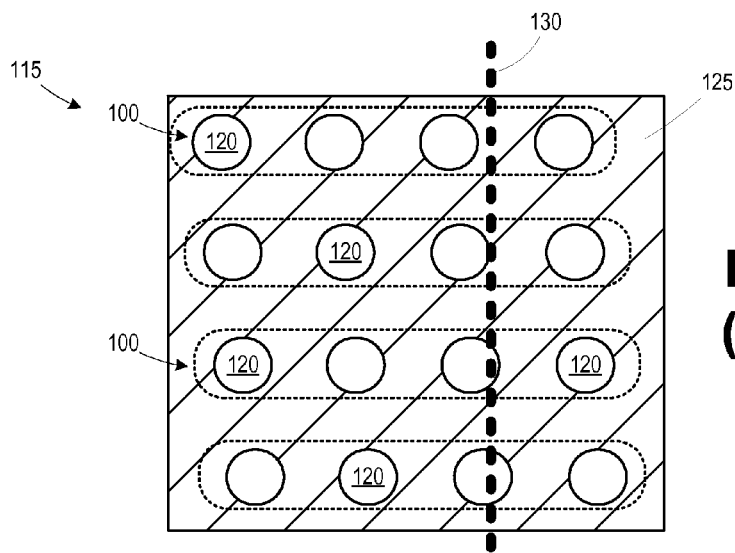
Figure 1D:
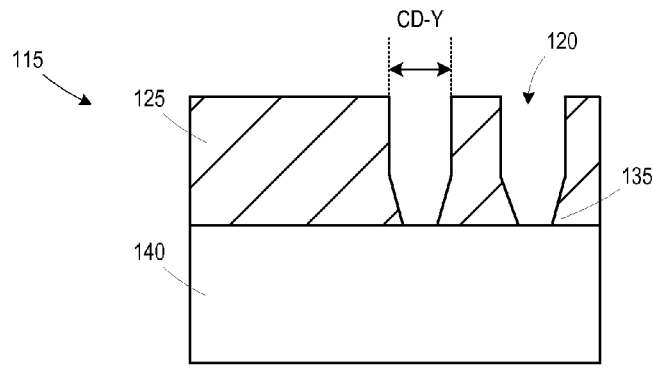

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to forming an array of patterns having spacing characteristics in two directions for use in photolithography, etch or subsequent process characterization. The use of patterns with different characteristic pitches or spacings allows the efficacy of the photolithography, etch or subsequent process to be evaluated for patterns that more closely match actual design patterns in the device or product. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

Figure 2A:
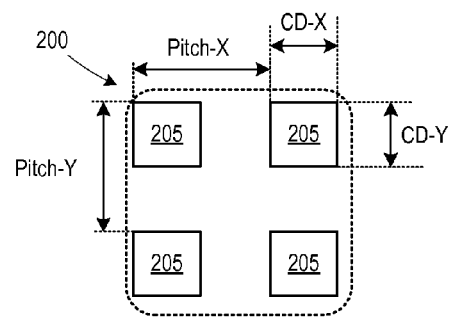
FIGS. 2A-2E illustrate the use of a test pattern exhibiting pitch characteristics in multiple directions for defining a reticle for patterning test wafers to allow characterization of a photolithography, etch or subsequent process step for the formation of devices, contact openings or final metal-filled contacts on a wafer.

FIGS. 2A-2D illustrate the use of a test pattern exhibiting pitch characteristics in multiple directions for defining a reticle for patterning test wafers to allow characterization of a photolithography, etch or subsequent process for the formation of devices, contacts or final metal-filled contacts on a wafer. As used herein, the term substrate may be applied to an optical structure, such as a reticle, or to a wafer including a plurality of process layers formed thereon. FIG. 2A is a diagram illustrating a pattern 200 of features 205 defined for a photolithography process being evaluated. The pattern 200 is a rectangular array of features and exhibits a pitch in the x-direction, Pitch-X, and a pitch in the y-direction, Pitch-Y. The pattern 200 also defines critical dimensions in the x-direction and the y-direction, CD-X, CD-Y, respectively.

Figure 2B:
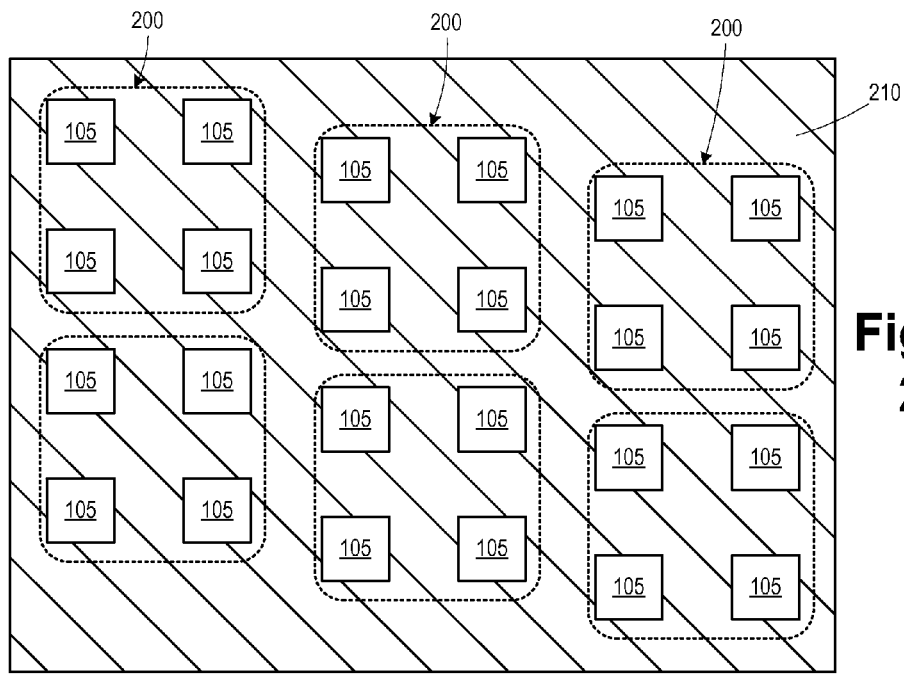
Figure 2C:
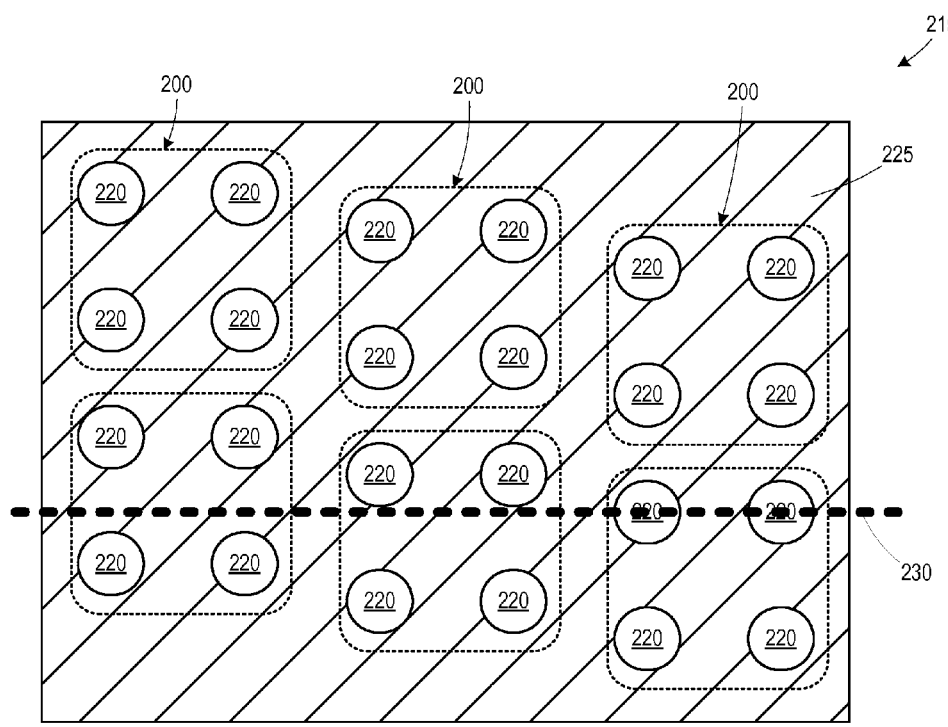
Figure 2D:
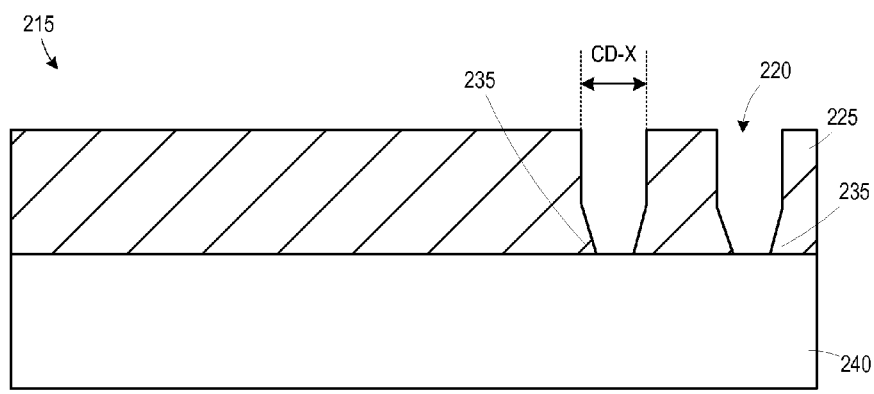

As shown in FIG. 2B, the pattern 200 is formed on a reticle 210 and is repeated in the x-direction with an offset in the y-direction between instances of the pattern 200 to allow measurement of CD-X. As shown in FIG. 2C, the reticle 210 is used to print a test wafer 215 to form patterns 220 in a photoresist layer 225. Alternatively, the layer 225 may be a dielectric layer in which contact openings are etched or filled with metal. The test wafer 215 is cleaved along a cleavage line 230 to cross-section the test wafer 215 to allow analysis of the patterns 220, as illustrated in FIG. 2D. Although the cleavage line 230 is illustrated as being horizontal, in some embodiments, the cleavage line 230 may have a different orientation, such as vertical or at an oblique angle.

In FIG. 2D, the patterns 220 intersected by the cleavage line 230 are illustrated. The staggering provides a higher probability that any given cleavage line will intersect the center of two or more adjacent patterns 220, where the most useful process data may be collected. The patterns 220 can be measured to determine a critical dimension in the x-direction, CD-X, due to the orientation of the pattern, the staggering and the x-direction of the cleavage line 230. Due to the availability of two or more adjacent holes in pattern 220, the measurement statistics in a wafer field are improved, since, in practice, the center locations (centroids) and shape (ellipticity, deformation, noisy contact outline) vary locally in an exposure field, as well as across the wafer. Outer regions 235 away from the center of the contact opening of the patterns 220 may exhibit scumming (photoresist residue) defects or a shallow sidewall angle, which could hinder the formation of contact openings in a dielectric layer 240 disposed below the photoresist layer 225. The shape of the contact profile is useful feedback for improving lithography, etch and subsequent process steps.

Figure 2E:
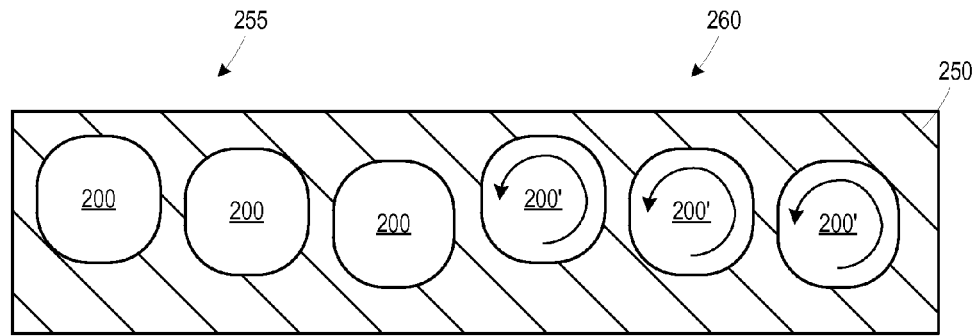

FIG. 2E illustrates a reticle 250 where the pattern 200 is formed in a first region 255 and shifted in the y-direction to allow measurement of CD-X. In other embodiments, as discussed below in reference to FIG. 6, the pattern 200 may be shifted in both the X and Y directions. In a second region 260 of the reticle 250, the pattern 200' is rotated by 90 degrees and again shifted in the y-direction. Due to the rotation of the pattern 200', the CD-Y measurements may be evaluated. Thus, with a single cleavage of a wafer patterned with the reticle 250, both CD-X and CD-Y may be evaluated. This example with rotated patterns 200' may be applied to a symmetrical imaging system. Other angles beside 90 degrees, such as 45, 135 or oblique, depending on the imaging symmetry, may be applied to pattern 200'. In fact, patterns with more than two rotations can be placed in a shifted configuration on reticle 250.

Alternative patterns may be used to evaluate different portions of a semiconductor chip design to determine the effectiveness of the photolithography, etch or subsequent process steps for different types of geometries. The use of multiple patterns allows consideration of different pitches or spacings in different directions and the determination of multiple critical dimensions. FIGS. 3-7 below illustrate exemplary patterns of features that exhibit characteristic spacings, such as pitch.

Figure 3:
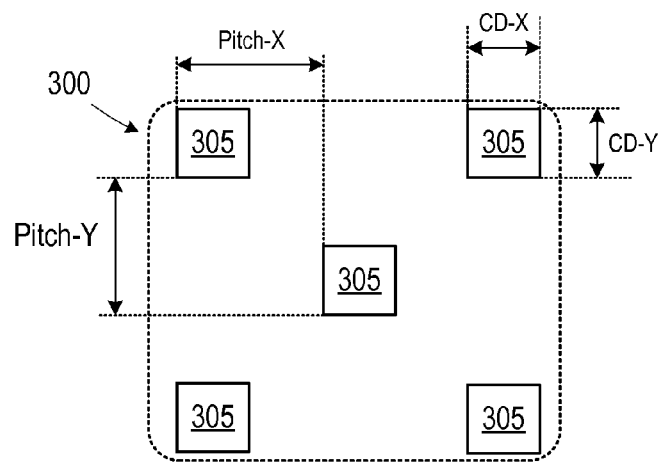
FIG. 3 is a diagram of an alternative test pattern exhibiting staggering.
Figure 4:
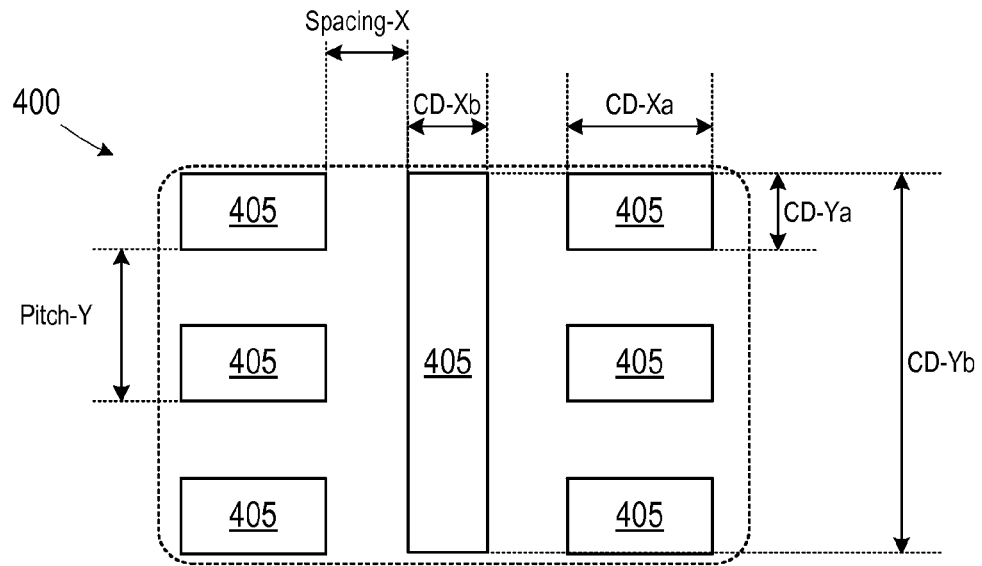
FIG. 4 is a diagram of an alternative test pattern exhibiting tip-to-line spacing.
Figure 5:
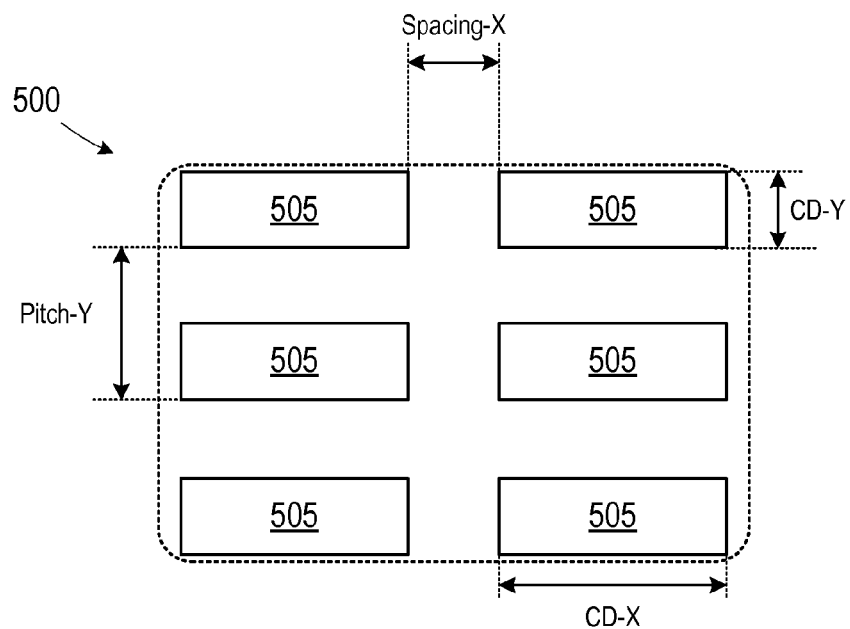
FIG. 5 is a diagram of an alternative test pattern exhibiting tip-to-tip spacing.

FIG. 3 is a diagram of a pattern 300 of features 305 defined for a photolithography or other process being evaluated. The pattern 300 exhibits an array of staggered features 305, with different patterning properties of the pattern 300 as compared to the pattern 200 of FIG. 2A. FIG. 4 is a diagram of a pattern 400 of features 405 that define a pitch in the y-direction, Pitch-Y, a tip-to-side spacing characteristic in the x-direction, Spacing-X, and critical dimensions, CD-Xa, CD-Ya, CD-Xb and CD-Yb. FIG. 5 is a diagram of a pattern 500 of features 505 that define a pitch in the y-direction, Pitch-Y, a tip-to-tip spacing characteristic in the x-direction, Spacing-X, and critical dimensions, CD-X and CD-Y.

Figure 6:
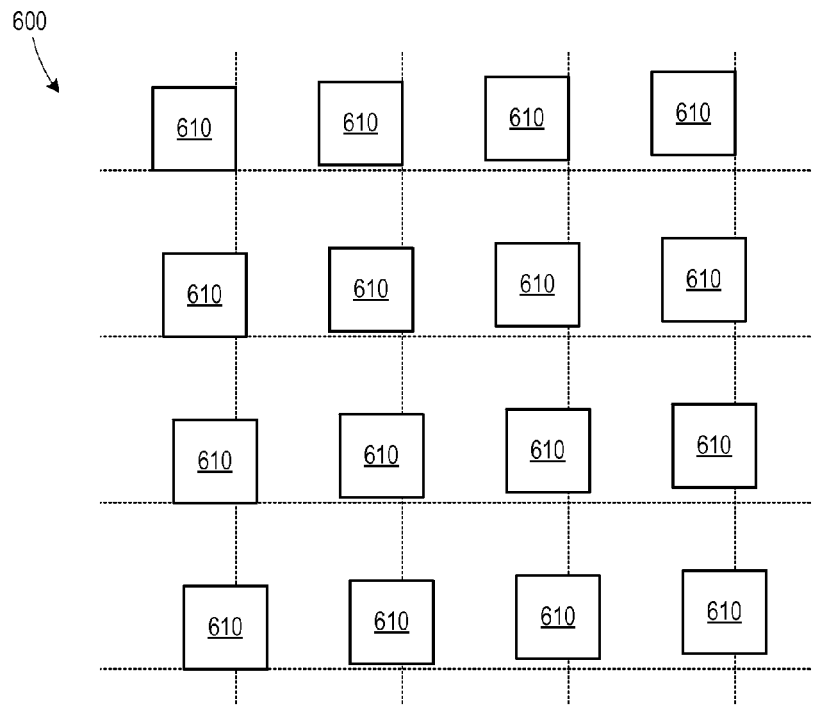
FIG. 6 is a diagram of an alternative test pattern exhibiting X and Y shifting.

FIG. 6 is a diagram of an alternative test pattern 600 where the unit cells 610 are staggered in both the X and the Y direction. This approach allows flexibility with respect to the cleavage line orientation.

Figure 7:
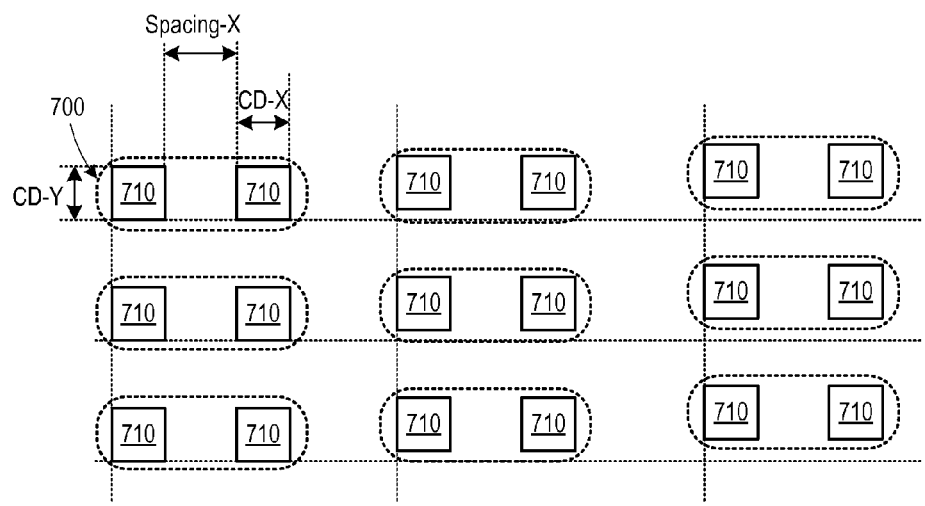
FIG. 7 is a diagram of an alternative test pattern exhibiting spacing in a first direction and shifting in a second direction.

FIG. 7 is a diagram of a test pattern 700 of features 710 that exhibit a spacing in the x-direction, Spacing-X, and critical dimensions CD-X, CD-Y. The test pattern 700 may be replicated and shifted in the Y-direction, intended for horizontal wafer cleavage.

In general, multiple patterns 200, 300, 400, 500, and 700 may be used to evaluate different portions of a design with different spacing and CD characteristics. The patterns are not restricted to rectangular features or layouts, or to symmetrical layouts. Circular, oval or corner-chopped features may also be employed, and any aspect (length to width) ratio may be defined. The shape is also not limited to simple rectangular shapes. In some embodiments, Z-shaped, T-shaped, L-shaped, or other more complex polygon target shapes may be used. The patterns 200, 300, 400, 500, and 700 define a unit cell that can be replicated, rotated and staggered to allow a single cleavage to provide a cross-section that allows the measurement of X, Y, and potentially critical dimensions at other angles. The unit cells are defined such that a pattern region has a consistent dose signature. Multiple patterns such as 200, 300, 400, 500, and 700 may be mixed within a given cross-section array. Patterns with different parameters and geometries are typically defined on the same reticle to characterize patterning at the same or different process conditions for different geometries. In some embodiments, the unit cell may be a portion of or an entire logic circuit or memory cell, such as an SRAM cell.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended for the details of construction or design shown herein, other than as described in the claims below. It is therefore evident that the particular embodiments disclosed above may be altered or modified and all such variations are considered within the scope and spirit of the invention. Note that the use of terms, such as "first," "second," "third," or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a first plurality of instances of a first pattern on a substrate, said first pattern including a plurality of features defining a first spacing between features in a first direction, wherein said instances in said first plurality are offset from one another at least in a second direction other than said first direction;
   cleaving said substrate along a cleavage line; and
   measuring at least a first critical dimension of a feature in said first plurality of instances intersected by said cleavage line.

2. The method of claim 1, further comprising:
   forming a second plurality of instances of said first pattern on said substrate, wherein said instances in said second plurality are rotated with respect to said instances in said first plurality, and said instances in said second plurality are offset from one another in said first direction; and measuring at least a second critical dimension of a feature in said second plurality of instances intersected by said cleavage line.

3. The method of claim 1, further comprising:

forming a second plurality of instances of a second pattern on said substrate, said second pattern including a second plurality of features defining a second spacing between features in said first direction, wherein said instances in said second plurality are offset from one another in said second direction; and measuring at least a second critical dimension of a feature in said second plurality of instances intersected by said cleavage line.

4. The method of claim 1, wherein said plurality of features in said first pattern define a second spacing between features in said second direction.

5. The method of claim 4, wherein said features comprise a rectangular array of features.

6. The method of claim 4, wherein said features comprise a staggered array of features.

7. The method of claim 4, wherein said features comprise a vertical feature and a plurality of horizontal features, wherein said first spacing comprises a tip-to-side spacing between said vertical feature and said horizontal features and said second spacing comprises a spacing between adjacent horizontal features.

8. The method of claim 4, wherein said features comprise a plurality of horizontal features, wherein said first spacing comprises a tip-to-tip spacing between said horizontal features and said second spacing comprises a spacing between adjacent horizontal features.

9. The method of claim 8, wherein said plurality of features comprise features having different sizes.

10. The method of claim 1, further comprising:

forming a reticle comprising said first plurality of instances of said first pattern; and patterning said substrate using said reticle to form said first plurality of instances of said first pattern on said substrate.

* * * * *